US011063385B2

(12) United States Patent
Gu

(10) Patent No.: US 11,063,385 B2
(45) Date of Patent: Jul. 13, 2021

(54) POWER INTERFACE, MOBILE TERMINAL, AND POWER ADAPTER

(71) Applicant: GUANGDONG OPPO MOBILE TELECOMMUNICATIONS CORP., LTD., Guangdong (CN)

(72) Inventor: Guodong Gu, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 80 days.

(21) Appl. No.: 16/230,406

(22) Filed: Dec. 21, 2018

(65) Prior Publication Data

US 2019/0123474 A1    Apr. 25, 2019

Related U.S. Application Data

(63) Continuation of application No. PCT/CN2017/082259, filed on Apr. 27, 2017.

(30) Foreign Application Priority Data

Jul. 27, 2016   (CN) .......................... 201620806997.4

(51) Int. Cl.
*H01R 13/504*       (2006.01)
*H01R 12/72*        (2011.01)
(Continued)

(52) U.S. Cl.
CPC ....... *H01R 13/504* (2013.01); *H01R 12/7088* (2013.01); *H01R 12/724* (2013.01);
(Continued)

(58) Field of Classification Search
CPC ............ H01R 13/6585; H01R 13/6477; H01R 12/724; H01R 13/504; H01R 13/26;
(Continued)

(56) References Cited

U.S. PATENT DOCUMENTS 9,231,356 B1    1/2016  Ju et al.
9,502,821 B2 *  11/2016 Little ................. H01R 13/6582
(Continued)

FOREIGN PATENT DOCUMENTS

CN        104064910 A     9/2014
CN        104505678 A     4/2015
(Continued)

OTHER PUBLICATIONS

European search report for Application No. EP17833277.1, dated Jun. 24, 2019 (7 pages).
(Continued)

*Primary Examiner* — Abdullah A Riyami
*Assistant Examiner* — Marcus E Harcum
(74) *Attorney, Agent, or Firm* — Ladas & Parry LLP

(57) ABSTRACT

A power interface may include a housing, a connection body, and a partition piece. The connection body may be arranged in the housing, configured to be connected to a circuit board, and include at least one power pin assembly. Each power-pin assembly may include a pair of power pins spaced apart from each other. The partition piece may be sandwiched between the pair of power pins, extend along a second direction perpendicular to the first direction, and include a tail end connected to the circuit board and a head end away from the circuit board and opposite to the tail end in the second direction. At least one of the head end and the rail end may define a through hole, and a reinforcing rib may be arranged in the through hole. A mobile terminal and a power adapter are also provided.

19 Claims, 6 Drawing Sheets

(51) Int. Cl.
*H01R 24/62* (2011.01)
*H01R 12/70* (2011.01)
*H01R 13/6585* (2011.01)
*H01R 13/26* (2006.01)
*H01R 13/405* (2006.01)
*H05K 1/18* (2006.01)
*H01R 24/60* (2011.01)
*H01R 107/00* (2006.01)

(52) U.S. Cl.
CPC .......... *H01R 12/725* (2013.01); *H01R 13/26* (2013.01); *H01R 13/405* (2013.01); *H01R 13/6585* (2013.01); *H01R 24/62* (2013.01); *H05K 1/18* (2013.01); *H01R 24/60* (2013.01); *H01R 2107/00* (2013.01); *H05K 2201/10189* (2013.01)

(58) Field of Classification Search
CPC .... H01R 13/405; H01R 12/725; H01R 24/60; H05K 1/18; H05K 2201/10189
USPC .............................. 439/660, 607.4, 276, 271
See application file for complete search history.

(56) References Cited

U.S. PATENT DOCUMENTS

| | | | | |
|---|---|---|---|---|
| 9,502,839 | B2* | 11/2016 | Tsai | H01R 13/5202 |
| 9,614,333 | B2* | 4/2017 | Tsai | H01R 24/70 |
| 9,865,962 | B2* | 1/2018 | Zhao | H01R 24/60 |
| 9,960,544 | B2* | 5/2018 | Ho | H01R 13/6595 |
| 10,367,307 | B2* | 7/2019 | Zhou | H01R 13/64 |
| 2001/0046354 | A1 | 11/2001 | Nguyen et al. | |
| 2014/0024257 | A1* | 1/2014 | Castillo | H01R 13/6585 |
| | | | | 439/607.05 |
| 2014/0194005 | A1* | 7/2014 | Little | H01R 13/6585 |
| | | | | 439/607.28 |
| 2015/0207280 | A1* | 7/2015 | Little | H01R 13/6591 |
| | | | | 439/607.34 |
| 2015/0255925 | A1 | 9/2015 | Katayanagi | |
| 2015/0303629 | A1 | 10/2015 | MacDougall et al. | |
| 2016/0013599 | A1* | 1/2016 | Ueda | H01R 12/724 |
| | | | | 439/607.01 |
| 2017/0018883 | A1* | 1/2017 | Chen | H01R 13/6585 |
| 2017/0025772 | A1* | 1/2017 | Yu | H01R 12/724 |
| 2017/0040721 | A1* | 2/2017 | Tsai | H01R 13/6594 |
| 2017/0047689 | A1* | 2/2017 | Yao | H01R 13/652 |
| 2017/0194755 | A1* | 7/2017 | Cheng | H01R 24/60 |
| 2017/0271823 | A1* | 9/2017 | Zhao | H01R 13/50 |
| 2017/0294726 | A1* | 10/2017 | Tsai | H01R 13/6581 |
| 2017/0338584 | A1* | 11/2017 | Yao | H01R 43/20 |
| 2017/0352968 | A1* | 12/2017 | Zhang | H01R 24/60 |
| 2017/0365951 | A1* | 12/2017 | Zhang | H01R 13/6586 |
| 2017/0373439 | A1* | 12/2017 | Wen | H01R 13/506 |
| 2017/0373442 | A1* | 12/2017 | Qiu | H01R 24/60 |
| 2018/0019531 | A1* | 1/2018 | Qiu | H01R 13/02 |
| 2019/0123470 | A1* | 4/2019 | Li | H01R 13/405 |

FOREIGN PATENT DOCUMENTS

| | | |
|---|---|---|
| CN | 204538336 U | 8/2015 |
| CN | 104882696 A | 9/2015 |
| CN | 204732558 U | 10/2015 |
| CN | 204966736 U | 1/2016 |
| CN | 105356097 A | 2/2016 |
| CN | 205178096 U | 4/2016 |
| CN | 105703157 A | 6/2016 |
| CN | 205282692 U | 6/2016 |
| CN | 106025615 A | 10/2016 |
| CN | 106252924 B | 4/2018 |
| EP | 2988376 A1 | 2/2016 |
| EP | 3101736 A1 | 12/2016 |
| WO | 2015113340 A1 | 8/2015 |

OTHER PUBLICATIONS

Indian First Office Action, Indian Application No. 201917001669, dated Jun. 19, 2020 (7 pages).

* cited by examiner

POWER INTERFACE, MOBILE TERMINAL, AND POWER ADAPTER

CROSS REFERENCE TO RELATED APPLICATIONS

The present application is a continuation-application of International (PCT) Patent Application No. PCT/CN2017/082259 filed Apr. 27, 2017, which claims foreign priority of Chinese Patent Application No. 201620806997.4, filed on Jul. 27, 2016, the entire contents of which are hereby incorporated by reference in their entireties.

TECHNICAL FIELD

The present disclosure relates to communication technology, and in particular to a power interface, a mobile terminal, and a power adapter.

BACKGROUND

With the continuous improvement of living conditions, mobile phones have become essential communication tools for people. In order to meet the requirements of users and improve the market competitiveness of the mobile phones, on one hand, researchers and developers continue to improve the performance of mobile phones; on the other hand, researchers and developers continue to improve and optimize the appearance of mobile phones. Charging sockets are important components for the mobile phones. On one hand, when charging the mobile phones, the mobile phones need to be charged via the charging sockets; on the other hand, it is possible to achieve data transmission between the mobile phones and other devices by means of the charging sockets.

SUMMARY OF THE DISCLOSURE

According to an aspect of the present disclosure, a power interface may be provided. The power interface may include a housing, a connection body arranged in the housing and a partition piece. The connection body may be configured to be connected to a circuit board, and include at least one power-pin assembly. Each of the at least one power-pin assembly may include a pair of power pins spaced apart from each other in a first direction. The partition piece may be sandwiched between the pair of power pins, extend along a second direction perpendicular to the first direction, and include a tail end connected to the circuit board and a head end away from the circuit board and opposite to the tail end in the second direction. At least one of the head end and the tail end may define a through hole and have a reinforcing rib arranged in the through hole.

According to another aspect of the present disclosure, a mobile terminal may be provided. The mobile terminal may include a circuit board, a housing, at least two power pins spaced apart from each other, a partition piece sandwiched between the at least two power pins and an encapsulation member. The at least two power pins may be arranged in the housing and configured to be connected to the circuit board. The partition piece may include a tail end connected to the circuit board and a head end away from the circuit board and opposite to the tail end. At least one of the head end and the tail end may define a through hole and have a reinforcing rib arranged in the through hole. The encapsulation member may be configured to wrap the partition piece and the at least two power pins, such that the partition piece may be insulated from the at least two power pins by the encapsulation member.

According to another aspect of the present disclosure, a power adapter may be provided. The power adapter may include a circuit board and a power interface configured to be connected to the circuit board. The power interface may include a housing, a data pin received in the housing and connected to the circuit board, at least two power pins spaced apart from each other, arranged in the housing and configured to be connected to the circuit board and a partition piece sandwiched between the at least two power pins to support the at least two power pins. The partition piece may include a tail end connected to the circuit board, a head end away from the circuit board and opposite to the tail end, and a connection portion connected between the head end and the tail end. At least one of the head end and the tail end may define a through hole and have a reinforcing rib arranged in the through hole. The connection portion may define a notch.

DETAILED DESCRIPTION

Figure 1:
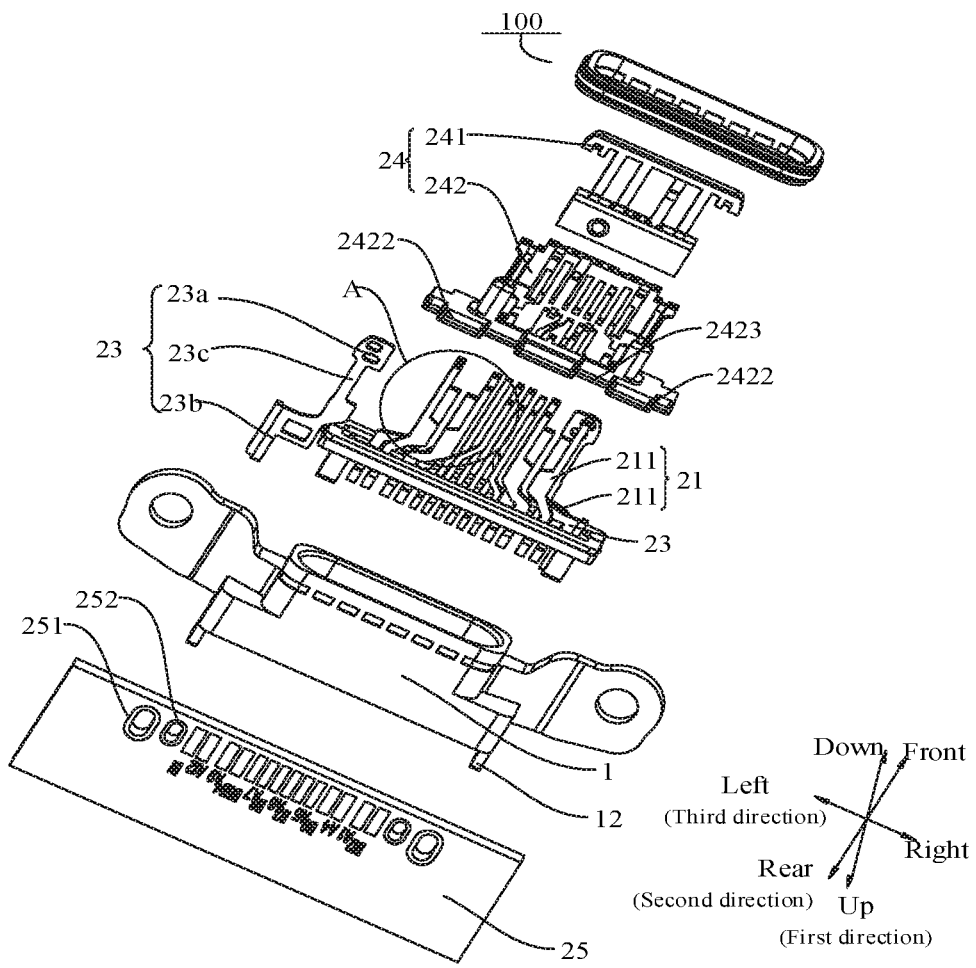
FIG. 1 is an exploded view of a power interface according to an embodiment of the present disclosure.

Embodiments of the present disclosure will be described in detail below, and examples of the embodiments will be illustrated in the accompanying drawings. The embodiments described below with reference to the drawings are illustrative and are intended to explain the present disclosure, and cannot be construed as a limitation to the present disclosure.

In the description of the present disclosure, it is to be understood that terms such as "top", "bottom", "front", "rear", "left", "right", "inner", "outer", "circumference", and the like, refer to the orientations and locational relations illustrated in the accompanying drawings. Thus, these terms used here are only for describing the present disclosure and for describing in a simple manner, and are not intended to indicate or imply that the device or the elements are arranged to locate at the specific directions or are structured and performed in the specific directions, which could not to be understood as limiting the present disclosure.

In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the description of the present disclosure, "a plurality of" means two or more, such as two, three, and the like, unless specified otherwise.

In the present disclosure, unless specified or limited, otherwise, terms "mounted", "connected", "coupled", "fixed", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by one skilled in the art depending on specific contexts.

The power interface according to an embodiment of the present disclosure may include a housing, a connection body arranged in the housing and a partition piece. The connection body may be configured to be connected to a circuit board, and include at least one power-pin assembly. Each of the at least one power-pin assembly may include a pair of power pins spaced apart from each other in a first direction. The partition piece may be sandwiched between the pair of power pins, extend along a second direction perpendicular to the first direction, and include a tail end connected to the circuit board and a head end away from the circuit board and opposite to the tail end in the second direction. At least one of the head end and the tail end may define a through hole and have a reinforcing rib arranged in the through hole.

In another embodiment, the reinforcing rib may include a first end and a second end opposite to the first end, both the first end and the second end are connected to the partition piece, and an extending direction from the first end to the second end may be perpendicular to the first and second direction.

In further another embodiment, the reinforcing rib may include a first end and a second end opposite to the first end, both the first end and the second end are connected to the partition piece, and an extending direction from the first end to the second end may be the second direction.

In still another embodiment, the reinforcing rib may include a first end and a second end opposite to the first end, both the first end and the second end are connected to the partition piece, and an extending direction from the first end to the second end may form an angle with a third direction perpendicular to the first and second direction.

In still further another embodiment, a reinforcing protrusion may protrude from an outer face of the head end in a direction away from a center of the power interface.

In another embodiment, the partition piece may include a connection portion connected between the head end and the tail end define a notch.

In further another embodiment, a crimping may be arranged at the tail end, and the crimping may be bent in a direction towards one of the pair of power pins.

In still another embodiment, the power interface may further include an encapsulation member, the partition piece and the connection body may be wrapped by the encapsulation member.

In still further another embodiment, the encapsulation member may be made of electrically insulative and heat-conductive material.

In another embodiment, the encapsulation member may include a first encapsulation portion and a second encapsulation portion connected to the first encapsulation portion. The second encapsulation portion may define a plurality of receiving groove, and a plurality of embedding protrusions may be arranged on the first encapsulation portion. The plurality of receiving grooves may be in one-to-one correspondence with the plurality of embedding protrusions.

In further another embodiment, the connection body may further include a data pin. At least one of the pair of power pins may include an expanded portion, and the expanded portion may have a cross-sectional area larger than that of the data pin of the connection body to increase a current load of the at least one of the pair of power pins.

In still another embodiment, an end of each of the pair of power pins may be connected to the circuit board, a recess may be defined in the expanded portion at a position that away from the circuit board.

In still further another embodiment, the expanded portion may be located in the middle part of the at least one of the pair of sub-pins.

In another embodiment, the expanded portion may have a cross-sectional area S, and the cross-sectional area S may satisfy: $S \geq 0.09805$ mm$^2$.

In further another embodiment, each of the pair of power pins may have a thickness D, and the thickness D may satisfy: $0.1$ mm$\leq D \leq 0.3$ mm.

The mobile terminal according to an embodiment of the present disclosure may include a circuit board, a housing, at least two power pins spaced apart from each other, a partition piece sandwiched between the at least two power pins and an encapsulation member. The at least two power pins may be arranged in the housing and configured to be connected to the circuit board. The partition piece may include a tail end connected to the circuit board and a head end away from the circuit board and opposite to the tail end. At least one of the head end and the tail end may define a through hole and have a reinforcing rib arranged in the through hole. The encapsulation member may be configured to wrap the partition piece and the at least two power pins, such that the partition piece may be insulated from the at least two power pins by the encapsulation member.

In an embodiment, the partition piece may include a connection portion connected between the head end and the tail end, notch may be defined in the connection portion. A crimping may be arranged at the tail end, and the crimping may be bent in a direction towards one of the pair of power pins.

In another embodiment, the encapsulation member may include a first encapsulation portion and a second encapsulation portion, the first encapsulation portion may be embedded into the second encapsulation portion. The second encapsulation portion may define a plurality of receiving groove, and a plurality of embedding protrusions may be arranged on the first encapsulation portion. The plurality of receiving grooves may be in one-to-one correspondence with the plurality of embedding protrusions.

The power adapter according to an embodiment of the present disclosure may include a circuit board and a power interface configured to be connected to the circuit board. The power interface may include a housing, a data pin received in the housing and connected to the circuit board, at least two power pins spaced apart from each other, arranged in the housing and configured to be connected to the circuit board and a partition piece sandwiched between the at least two power pins to support the at least two power pins. The partition piece may include a tail end connected to the circuit board, a head end away from the circuit board and opposite to the tail end, and a connection portion connected between the head end and the tail end. At least one of the head end and the tail end may define a through hole and have a reinforcing rib arranged in the through hole. The connection portion may define a notch.

In still another embodiment, the power adapter may further include an encapsulation member configured to wrap the partition piece, the data pin and the at least two power pins, such that the partition piece may be insulated from the at least two power pins by the encapsulation member. The encapsulation member may include a first encapsulation portion and a second encapsulation portion, the first encapsulation portion may be embedded into the second encapsulation portion. The second encapsulation portion may define a plurality of receiving groove, and a plurality of embedding protrusions may be arranged on the first encapsulation portion. The plurality of receiving grooves may be in one-to-one correspondence with the plurality of embedding protrusions.

The power interface of the present disclosure may include a housing, a connection body and a partition piece. The connection body may be arranged in the housing, configured to be connected to a circuit board, and comprising at least a pair of power pins. Each pair of power pins comprises a pair of sub-pins spaced apart from each other in an up-down direction. The partition piece may be sandwiched between the pair of sub-pins, and include a head end close to a front end of each power pin and a tail end close to a rear end of each power pin. The head end may define a through hole and have a reinforcing rib arranged in the through hole.

In an embodiment, the reinforcing rib may extend in a left-right direction.

In another embodiment, the reinforcing rib may extend in a front-rear direction.

In still further another embodiment, the reinforcing rib may have an extending direction forming an angle with a left-right direction.

In another embodiment, the reinforcing rib may have an extending direction forming an angle with a left-right direction.

In further another embodiment, the reinforcing protrusion may be located on at least one of a side wall face and a front end face of the head end.

In still another embodiment, the reinforcing protrusion may be located on at least one of a side wall face and a front end face of the head end.

In still further another embodiment, a crimping may be arranged at the tail end, and one of the pair of power pins is wrapped by the crimping.

In another embodiment, the tail end may define the through hole.

In further another embodiment, the tail end may include the reinforcing rib arranged in the through hole.

In still another embodiment, a recess may be defined in the expanded portion at a position that is close to a front end of the at least one of the pair of sub-pins.

In still further another embodiment, the expanded portion may be located in the middle part of the at least one of the pair of sub-pins.

In another embodiment, the expanded portion may be located in the middle part of the at least one of the pair of sub-pins.

In further another embodiment, each of the pair of sub-pins may have a thickness D, and the thickness D may satisfy: $0.1 \text{ mm} \leq D \leq 0.3 \text{ mm}$.

In still another embodiment, each of the pair of sub-pins may have a contact face configured to be electrically connected to a power adapter, the contact face may have a width W in a width direction of each of the pair of sub-pins, and the width W may satisfy: $0.24 \text{ mm} \leq W \leq 0.32 \text{ mm}$.

In still further another embodiment, the power interface may be a USB Type-C interface.

The mobile terminal according to an embodiment of the present disclosure may include the power interface mentioned above.

In an embodiment, the mobile terminal may be a mobile phone, a tablet computer or a laptop.

A power adapter according to an embodiment of the present disclosure may include the power interface mentioned above.

In the following, a power interface 100 may be will be described in embodiments of the present disclosure with reference to FIGS. 1-11. It should be understood that, the power interface 100 may include an interface configured for charging or data transmission, and may be arranged in a mobile terminal such as a mobile phone, a tablet computer, a laptop, or any other suitable mobile terminal having a rechargeable function. The power interface 100 may be electrically connected to a corresponding power adapter to achieve a communication of electrical signals and data signals.

Referring to FIGS. 1-11, the power interface 100 according to an embodiment of the present disclosure may include a housing 1, a connection body 2, and a partition piece 23.

More specifically, the connection body 2 may be arranged in the housing 1. The connection body 2 may be configured to be connected to a circuit board 25, and may include at least one power-pin assembly 21. In this embodiment, each power-pin assembly 21 may include a pair of power pins 211 spaced apart from each other in a first direction, that is, an up-down direction (the up-down direction as shown in FIG. 1). The partition piece 23 may be sandwiched between the two power pins 211. The partition piece 23 may extend along a second direction perpendicular to the first direction and include a tail end connected to the circuit board 25 and a head end 23a away from the circuit board 25 and opposite to the tail end 23b in the second direction. The partition piece 23 may have a head end 23a close to a front end of the power pin 211 (the front end as shown in FIG. 1), a tail end 23b close to a rear end of the power pin 211 (the rear end as shown in FIG. 1), and a connection portion 23c connected between the head end 23a and the tail end 23b. More specifically, the tail end 23b may be the one connected to the circuit board 25, and the head end 23a may be the one away from the circuit board 25 and opposite to the tail end 2. At least one of the head end 23a and the tail end 23b may define a through hole 231, and a reinforcing rib 232 may be arranged in the through hole 231. The partition piece 23 may be configured to support the power pins 211. Therefore, it is possible to avoid poor contact between a connecting line and the power interface 100 caused by the movement of the pair of power pins 211 which are spaced apart from each other in the up-down direction towards each other when the connection line is inserted into the power interface. In this way, it is possible to ensure the reliability of the connection between the connection line and the power interface 100.

In addition, the partition piece 23 defines the through hole 231, so as to save the material of the partition piece 23. The reinforcing rib 232 arranged in the through hole 231 can improve the structural strength of the partition piece 23 by arranging.

It should be noted that, the power interface 100 may be arranged on a mobile terminal, and a battery can be arranged inside the mobile terminal (e.g., a mobile phone, a tablet computer, a notebook computer, etc.). The battery may be charged by an external power source via the power interface 100.

In the power interface 100 of the embodiment of the present disclosure, by arranging the partition piece 23 between the pair of power pins 211 which are spaced apart from each other in the up-down direction, it is possible to support the power pins 211, and avoid poor contact between a connecting line and the power interface 100 caused by the movement of the pair of power pins 211 which are spaced apart from each other in the up-down direction towards each other when the connection line is inserted into the power interface. In this way, it is possible to ensure the reliability of the connection between the connection line and the power interface 100. In addition, the partition piece 23 defines the through hole 231 and the reinforcing rib 232 arranged in the through hole 231 could not only save the material of the partition piece 23, but also improve the structural strength of the partition piece 23.

Figure 2:
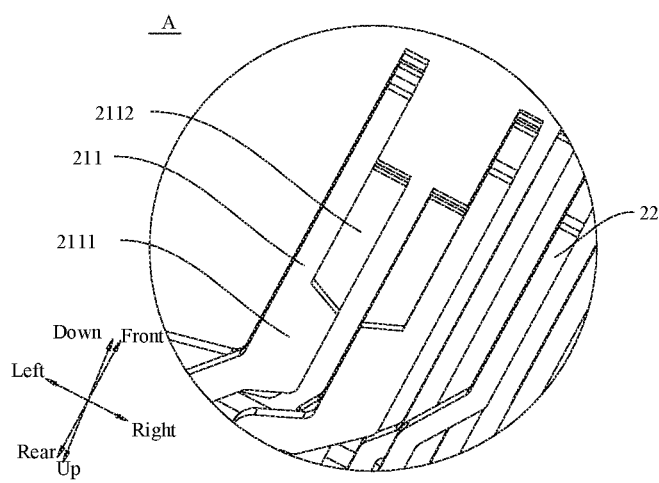
FIG. 2 is a partially enlarged view of circle A in FIG. 1.

In some embodiments of the present disclosure, as shown in FIG. 2, at least one power pin 211 may include an expanded portion 2111. The expanded portion 2111 may have a cross-sectional area larger than that of a data pin 22 of the connection body 2. In this way, the current load of the power pins 211 may be increased, and the transmission speed of the current may be improve. In this way, the power interface 100 may have a fast charging function, thereby improving the charging efficiency of the battery.

Figure 11:
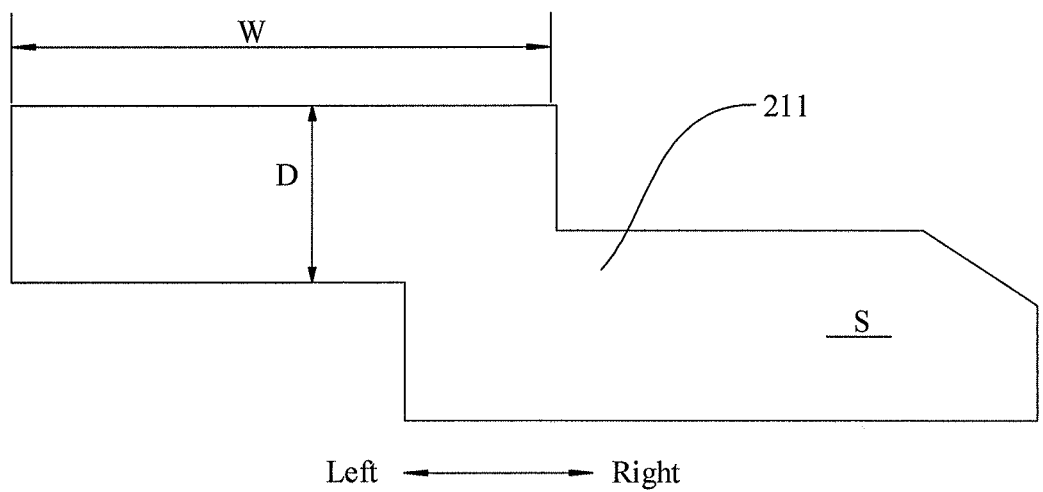
FIG. 11 is a structural view of a power pin according to some embodiments of the present disclosure.

In some embodiments, as shown in FIG. 11, the cross-sectional area of the expanded portion 2111 may be defined as S, and S≥0.09805 mm². It has been experimentally verified that when S≥0.09805 mm², the current load of the power pins 211 may be at least 10A. Therefore, the charging efficiency can be improved by increasing the current load of the power pins 211. After further tests, when S=0.13125 mm², the current load of the power pins 211 may be 12 A or more, which can improve charging efficiency.

Furthermore, as shown in FIG. 11, a thickness of the power pin 211 may be defined as D, and 0.1 mm≤D≤0.3 mm. It has been experimentally verified that when 0.1 mm≤D≤0.3 mm, the current load of the power pins 211 is at least 10A. In this way, it is possible to improve the charging efficiency by increasing the current load of the power pins 211. After further tests, when D=0.25 mm, the current load of the power pins 211 may be greatly increased, and the current load of the power pins 211 is 12 A or more, thereby improving the charging efficiency.

Figure 9:
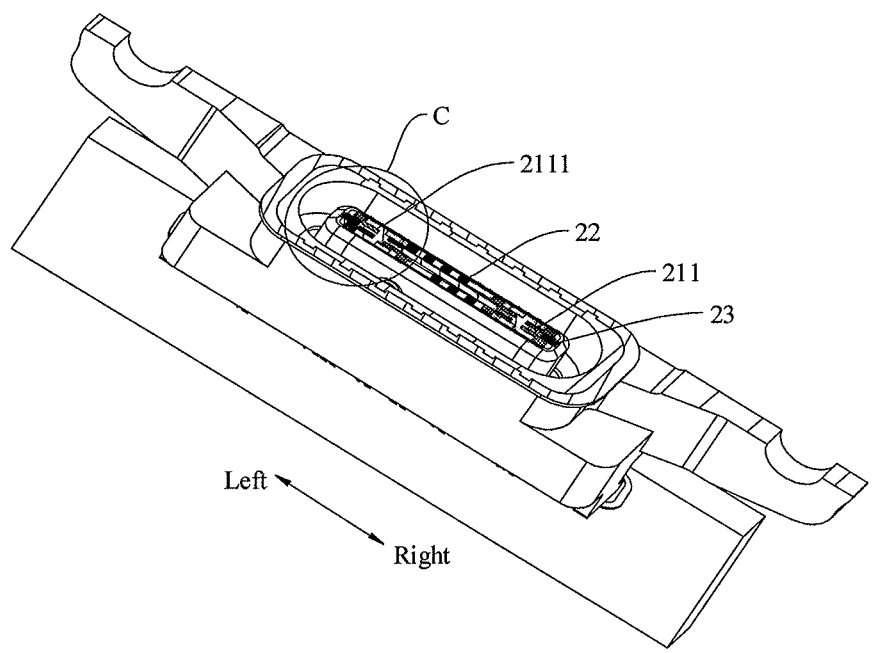
FIG. 9 is a cutaway view of the power interface viewing in still a further angle according to some embodiments of the present disclosure.
Figure 10:
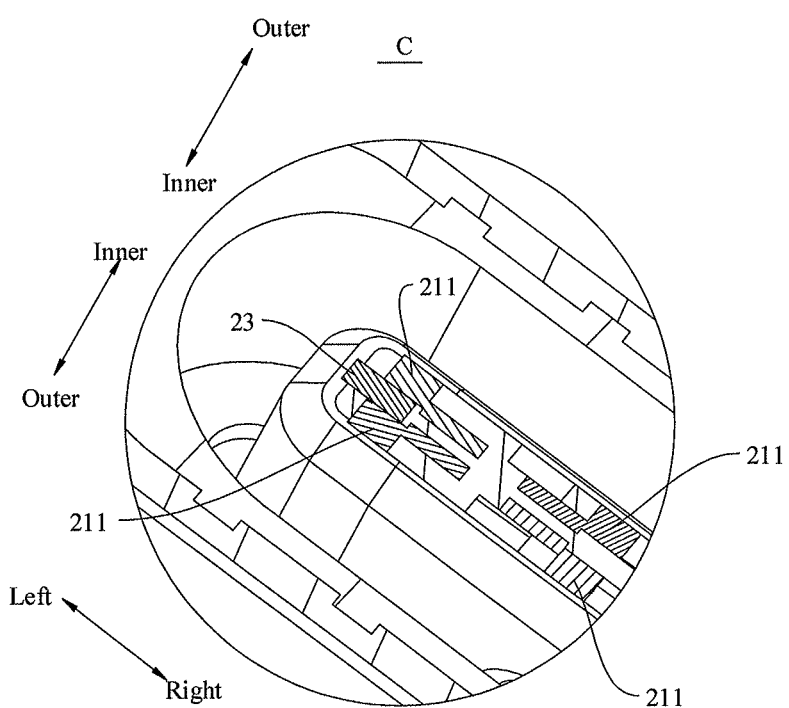
FIG. 10 is a partially enlarged view of circle C in FIG. 9.

Referring to FIGS. 9-11, each power pin 211 may have a contact face configured to be electrically connected to the power adapter. In a width direction of the power pin 211 (i.e. the left-right direction shown in FIG. 6), a width of the contact face may be defined as W, which meets 0.24 mm≤W≤0.32 mm. It has been experimentally verified that when 0.24 mm≤W≤0.32 mm, the current load of the power pin 211 is at least 10 A. In this way, it is possible to improve the charging efficiency by increasing the current load of the power pins 211. After further tests, when W=0.25 mm, the current load of the power pin 211 may be greatly increased, and the current load of the power pins 211 is 12 A or more, thereby improving the charging efficiency.

In the power interface 100 of the embodiment of the present disclosure, by spacing apart the tail end 23b of the partition piece 23 from the housing 1 and connecting the tail end 23b of the partition piece 23 to the connection body 2, it is possible to avoid producing interference with antenna signals, and thus the quality and the speed of signal transmission may be improved. In addition, both the tail end 23b and the housing 1 may be connected to the connection body 2. In this way, the partition piece 23, the housing 1, and the connection body 2 may be connected to each other, thereby improving the reliability of the connection among the partition piece 23, the housing 1, and the connection body 2.

Figure 5:
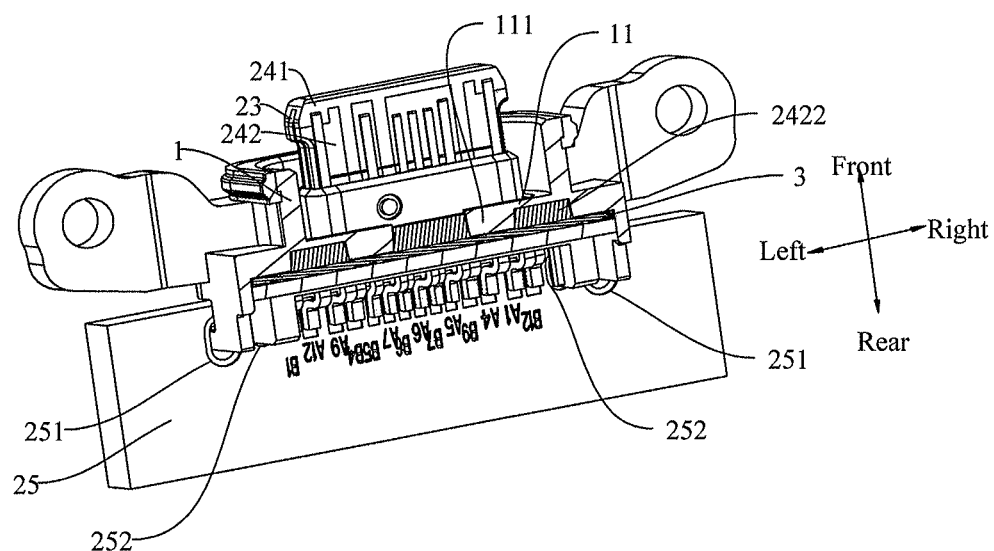
FIG. 5 is a cutaway view of the power interface viewing in another angle according to some embodiments of the present disclosure.

In some embodiments of the present disclosure, as shown in FIG. 1 and FIG. 5, a first pad 251 and a second pad 252 spaced apart from each other may be arranged on the circuit board 25. The housing 1 may be welded on the first pad 251, and the tail end 23b may be welded on the second pad 252. In this way, the housing 1 and the partition piece 23 may be connected to the circuit board 25, thereby firmly fixing the connection body 2 to the circuit board 25 and preventing the power pins 211 of the connection body 2 from falling off the circuit board 25, and thus the reliability of the operation of the power interface 100 may be ensured.

More specifically, the housing 1 may include a connected end 12 configured to connected to the circuit board 25. The connected end 12 may be substantially parallel to the tail end 23b of the partition piece 23, and spaced apart from the tail end 23b. The connected end 12 may be welded on the first pad 251. Furthermore, an end of each of the pair of power pins 211 may be connected to the circuit board 25.

According to some embodiments of the present disclosure, referring to FIG. 2, the expanded portion 2111 may be located in the middle of the power pin 211. In this way, the arrangement of the power pins 211 and the data pins 22 may be optimized, and the space of the power interface 100 may be fully utilized. Therefore, the compactness and the rationality of the configuration of the power interface 100 may be improved.

Furthermore, as shown in FIG. 2, a recess 2112 may be defined in the expanded portion 2111 at a position that is close to the front end of the power pin 211. It should be noted that, when the power interface 100 performs the fast charging function, the power pin 211 with the expanded portion 2111 may be used to carry a large charging current. When the power interface 100 performs the normal charging function, the recess 2112 defined in the expanded portion 2111 may prevent the power pin 211 from getting into contact with a corresponding pin of a power adapter. In this way, the power interface 100 in this embodiment may be applied to different power adapters. For example, when the power interface 100 performs the fast charging function, the power interface 100 may be electrically connected to a corresponding power adapter with the fast charging function. When the power interface 100 performs the normal charging function, the power interface 100 may be electrically connected to a corresponding normal power adapter. It should be noted that, the fast charging function herein may refer to a charging state in which the charging current is greater than or equal to 2.5 A, and the normal charging may refer to a charging state in which the charging current is less than 2.5 A.

Figure 6:
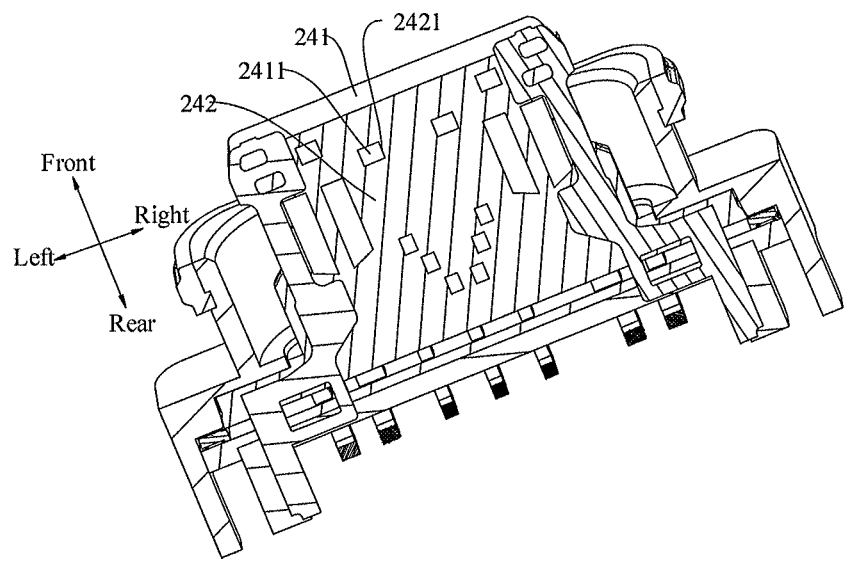
FIG. 6 is a cutaway view of the power interface viewing in yet another angle according to some embodiments of the present disclosure.
Figure 7:
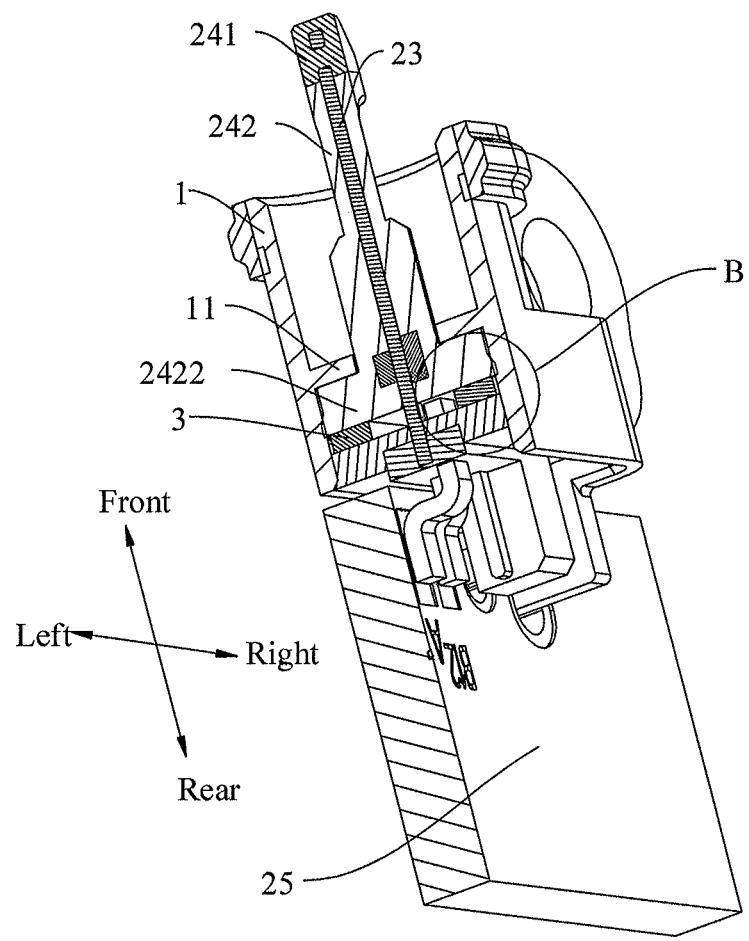
FIG. 7 is a cutaway view of the power interface viewing in a further angle according to some embodiments of the present disclosure.

In some embodiments of the present disclosure, as shown in FIGS. 1 and 5 and 6, the power interface 100 may further include an encapsulation member 24, and the partition piece 23 and the connection body 2 may be wrapped by the encapsulation member 24, such that the partition piece 23 may be insulated from the connection body 2 by the encapsulation member 24. More specifically, the partition piece 23 may be separated from the pair of power pins 211, that is to say, a gap may be formed between the partition piece 23 and the pair of power pins 211, at least parts of the encapsulation member 24 may be disposed between the partition piece 23 and each of the pair of power pins 211.

The encapsulation member 24 may be made of electrically insulative and heat-conductive material. The encapsulation member 24 may be configured to fix the partition piece 23, the power-pin assembly 21 and the data pins 22 of the connection body 2, thereby ensuring the reliability of the connection between the connection line of the power adapter and the power interface 100. The encapsulation member 24 may include a first encapsulation portion 241 and a second encapsulation portion 242 connected to first encapsulation portion 241. More specifically, the first encapsulation portion 241 may be embedded into the second encapsulation portion 242. The first encapsulation portion 241 and the second encapsulation portion 242 may match with and cooperate with each other. More specifically, the second encapsulation portion 242 may define a plurality of receiving groove 2421, and a plurality of embedding protrusions 2411 may be arranged on the first encapsulation portion 241. The plurality of receiving grooves 2421 may be in one-to-one correspondence with the plurality of embedding protrusions 2411, and cooperate with the plurality of embedding protrusions 2411. In this way, the reliability of the connection between the first encapsulation portion 241 and the second encapsulation portion 242 may be improved.

Figure 3:
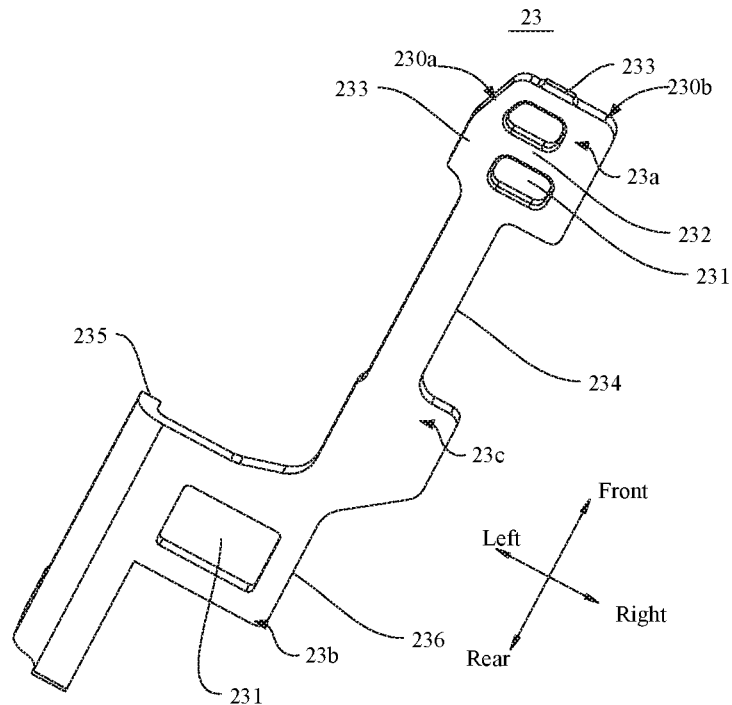
FIG. 3 is a structural view of a partition piece in the power interface according to some embodiments of the present disclosure.
Figure 4:
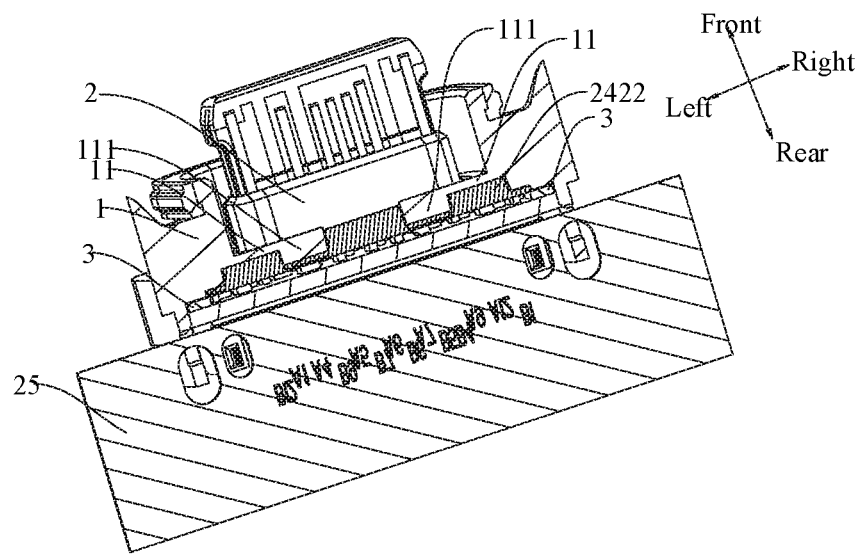
FIG. 4 is a cutaway view of the power interface according to some embodiments of the present disclosure.

In some embodiments of the present disclosure, as shown in FIG. 3, the reinforcing rib 232 may include a first end and a second end opposite to the first end, both the first end and the second end may be connected to the partition piece, and an extending direction from the first end to the second end may be perpendicular to the first and second direction, that is, the left-right direction. In this way, the structural strength of the partition piece 23 may be enhanced. Of course, the present disclosure may not be limited thereto. For example, an extending direction from the first end to the second end of the reinforcing rib 232 may be the second direction, that is, the front-rear direction, or an extending direction from the first end to the second end of the reinforcing rib 232 may be at an angle to the left-right direction, as long as the structural strength of the partition piece 23 may be enhanced.

In some embodiments of the present disclosure, as shown in FIG. 3, a reinforcing protrusion 233 that protrudes away from the connection body 2 may be arranged at the head end 23a. More specifically, the reinforcing protrusion 233 may protrude from an outer face of the head end 23a in a direction away from a center of the power interface 100. The reinforcing protrusion 233 may increase area of the contact face between the partition piece 23 and the encapsulation member 24, enhance the adhesion between the partition piece 23 and the encapsulation member 24, and make the connection between the partition piece 23 and the encapsulation member 24 more stable. In this way, the partition piece 23 and the connection body 2 may be better fixed together by the encapsulation member 24.

Alternatively, as shown in FIG. 3, herein, the outer face may include a side wall face 230a and a front end face 230b. Therefore, the reinforcing protrusion 233 may be located on at least one of a side wall face 230a and a front end face 230b of the head end 23a. For example, in the example shown in FIG. 3, the front end face of the head end 23a may be provided with the reinforcing protrusion 233, and the left-side wall face of the head end 23a may be also provided with the reinforcing protrusion 233. In this way, it is possible to increase the contact face between the partition piece 23 and the encapsulation member 24, enhance the adhesion between the partition piece 23 and the encapsulation member 24, and make the connection between the partition piece 23 and the encapsulation member 24 more stable. In this way, the partition piece 23 and the connection body 2 may be better fixed together by the encapsulation member 24.

As shown in FIG. 3, in order to increase the flexibility of the partition piece 23, a notch 234 may be defined in the connection portion 23c of the partition piece 23. The notch 234 in some embodiments may be defined in the middle of the partition piece 23. In this way, when the partition piece 23 is shifted upwardly or downwardly, the partition piece 23 may quickly return back to the original position due to the notch 234, which facilitates the connection between the connection line of the power adapter and the power interface 100 next time.

In some embodiments of the present disclosure, as shown in FIG. 3, a crimping 235 may be arranged at the tail end 23b, and the crimping 235 may be bent in a direction towards one of the pair of power pins 211. Therefore, one of the pair of power pins 211 may be configured to be wrapped by the crimping 235. On one hand, the crimping 235 may increase the contact face between the partition piece 23 and the encapsulation member 24, enhance the adhesion between the partition piece 23 and the encapsulation member 24, and make the connection between the partition piece 23 and the encapsulation member 24 more stable, thereby better fixing the partition piece 23 and the connection body 2 together by the encapsulation member 24. On the other hand, the crimping 235 may provide a protection to the power pin 211.

In addition, as shown in FIG. 3, the tail end 23b may also define a through hole 231. In this way, it is possible to further save the material of the partition piece 23. Of course, in order to ensure the structural strength of the partition piece 23, a reinforcing rib 232 may also be arranged in the through hole 231.

In the mobile terminal according to an embodiment of the present disclosure, by spacing apart the tail end 23b of the partition piece 23 from the housing 1 and connecting the tail end 23b of the partition piece 23 to the connection body 2, it is possible to avoid producing interference with antenna signals, and thus the quality and the speed of signal transmission may be improved. In addition, both the tail end 23b and the housing 1 may be connected to the connection body 2. In this way, the partition piece 23, the housing 1, and the connection body 2 may be connected to each other, thereby improving the reliability of the connection among the partition piece 23, the housing 1, and the connection body 2.

In another embodiment, as shown in FIG. 1 and FIG. 5, a first pad 251 and a second pad 252 spaced apart from each other may be arranged on the circuit board 25. The housing 1 may be welded on the first pad 251, and the tail end 23b may be welded on the second pad 252. In this way, the housing 1 and the partition piece 23 may be connected to the circuit board 25, thereby firmly fixing the connection body 2 to the circuit board 25 and preventing the power-pin assembly 21 of the connection body 2 from separating from the circuit board 25, and thus the reliability of the operation of the power interface 100 may be ensured.

In some embodiments of the present disclosure, as shown in FIG. 4, FIG. 5, FIG. 7, and FIG. 8, a first stopping plate 11 may be arranged in the housing 1. An engaging flange 2422 may be arranged on the second encapsulation portion 242 of the encapsulation member 24. The power interface 100 may further include a second stopping plate 3. In this case, the second stopping plate 3 may be arranged in the housing 1, connected to the housing 1, and spaced apart from the first stopping plate 11. The engaging flange 2422 may be sandwiched between the first stopping plate 11 and the second stopping plate 3. In this way, the encapsulation member 24 together with the connection body 2 wrapped by the encapsulation member 24 may be fixed in the housing 1 by the first stopping plate 11 and the second stopping plate 3, and the connection body 2 may be prevented from moving in the up-down direction of the housing 1 to prevent the connection body 2 from being separated from the housing 1. Therefore, when the connection line of the power adapter is inserted into the power interface 100, the reliability of the connection between the connection line and the power interface 100 may be improved.

In some embodiments, the housing 1 and the second stopping plate 3 may be made of metal, and the second stopping plate 3 may be welded on the housing 1. The housing 1 and the second stopping plate 3 made of metal may have a great structural strength. In this way, it is possible to enhance the structural strength of the power interface 100, and the power interface 100 may be prevented from being deformed after a long time of use or after frequent insertion and removal. In addition, since the inner space of the housing 1 is limited, when the second stopping plate 3 is welded on the housing 1, it is possible to simplify the processing and assembling processes, shorten manufacturing cycles, and reduce the manufacturing cost.

In some embodiments, the second stopping plate 3 may be made of stainless steel. In this way, it is possible to avoid the second stopping plate 3 from rusting, and thus the poor contact of the connection body 2 with the power adapter due to the rusting of the second stopping plate 3 may be prevented from occurring. Therefore, the reliability of the operation of the power interface 100 may be ensured.

Figure 8:
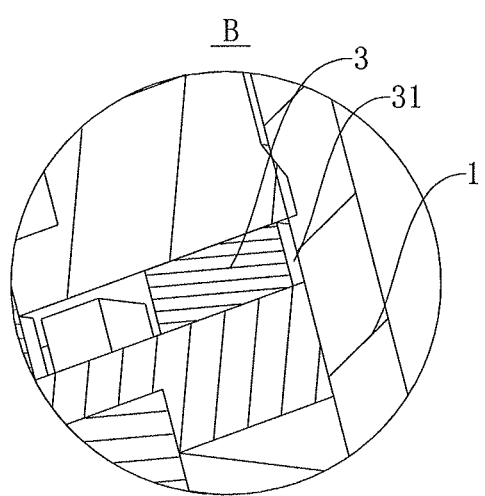
FIG. 8 is a partially enlarged view of circle B in FIG. 7.

In some embodiments of the present disclosure, as shown in FIG. 8, a gap 31 may be defined between the second stopping plate 3 and the housing 1, and an adhesive layer may be arranged in the gap 31. On one hand, the adhesive layer may further bond the second stopping plate 3 with the housing 1, to improve the reliability of the connection between the second stopping plate 3 and the housing 1. On the other hand, the adhesive layer may have a waterproof function, that is, the adhesive layer may prevent liquid from entering the power interface 100 via an open end of the power interface 100 and damaging of the circuit board 25 inside the power interface 100, and the like, thereby ensuring the reliability of the power interface 100.

More specifically, the adhesive layer may be a dispensing layer. Dispensing is a process in which electronic glue, oil or other liquid may be applied to a product by means of painting, potting, or dripping, to allow the product to be adhesive, potted, insulated, fixed, and have a smooth face. On one hand, the dispensing layer may further bond the second stopping plate 3 with the housing 1 to improve the reliability of the connection between the second stopping plate 3 and the housing 1. On the other hand, the dispensing layer may have a waterproof function, that is, the dispensing layer may prevent liquid from entering the power interface 100 via an open end of the power interface 100 and damaging of the circuit board 25 inside the power interface 100, and the like, thereby ensuring the reliability of the power interface 100.

In some embodiments of the present disclosure, as shown in FIGS. 4-7, the second stopping plate 3 may extend in a circumferential direction of the encapsulation member 24. On one hand, it is possible to improve the reliability of the connection between the second stopping plate 3 and the housing 1; on the other hand, it is also possible to enhance the fixing of the encapsulation member 24 and the connection body 2 by the second stopping plate 3. In this way it is possible to ensure that the encapsulation member 24 and the connection body 2 is securely fixed in the housing 1, and improve the reliability of the connection between a power line of the power adapter and the power interface 100.

In some embodiments, a plurality of second stopping plates 3 may be provided, thereby facilitating the processing of the second stopping plate 3. It should be noted that, the plurality of second stopping plates 3 may be spaced apart from each other along the circumferential direction of the housing 1, and the plurality of second stopping plates 3 may also form an annular stopping plate. The plurality of second stopping plates 3 may be respectively connected to the housing 1, in order to fix the connection body 2.

In some embodiments of the present disclosure, as shown in FIGS. 4-7, the first stopping plate 11 may also extend in the circumferential direction of the encapsulation member 24. In this way, it is possible to enhance the fixing of the encapsulation member 24 and the connection body 2 by the first stopping plate 11. In other embodiments, a stopping protrusion 111 may be arranged on a sidewall of the first stopping plate 11 that faces towards the second stopping plate 3. An engaging groove 2423 may be defined in the engaging flange 2422. The stopping protrusion 111 may be inserted in the engaging groove 2423 and engaged with the engaging flange 2422. In this way, the first stopping plate 11 and the second stopping plate 3 may prevent the connection body 2 from moving in the up-down direction in the housing 1, and may also prevent the connection body 2 from shaking in the housing 1 by the cooperation between the engaging flange 2422 and the stopping protrusion 111, and thus it is possible to ensure the reliability of the operation of the power interface 100.

Referring to FIGS. 1-11, the power interface 100 according to embodiments of the present disclosure is described in details. It is noted that, the following description only is exemplary, and is not limitation to the present disclosure.

For convenience to describe, an example where the power interface 100 is implemented as a Type-C interface is described. The Type-C interface may also be called an USB Type-C interface. The Type-C interface belongs to a type of an interface, and is a new data, video, audio and power transmission interface specification developed and customized by the USB standardization organization to solve the drawbacks present for a long time that the physical interface specifications of the USB interface are uniform, and that the power can only be transmitted in one direction.

The Type-C interface may have the following features: a standard device may declare its willing to occupy a VBUS (that is, a positive connection wire of a traditional USB) to another device through a CC (Configuration Channel) pin in the interface specification. The device having a stronger willing may eventually output voltages and currents to the VBUS, while the other device may accept the power supplied from the VBUS bus, or the other device may still refuse to accept the power; however, it does not affect the transmission function. In order to use the definition of the bus more conveniently, a Type-C interface chip (such as LDR6013) may generally classify devices into four types: DFP (Downstream-facing Port), Strong DRP (Dual Role Power), DRP, and UFP (Upstream-facing Port). The willingness of these four types to occupy the VBUS bus may gradually decrease.

The DFP may correspond to an adapter, and may continuously output voltages to the VBUS. The Strong DRP may correspond to a mobile power, and may give up outputting voltages to the VBUS only when the strong DRP encounters the adapter. The DRP may correspond to a mobile phone. Normally, the DRP may expect other devices to supply power to itself. However, when encountering a device that may have a weaker willingness, the DRP may also output the voltages and currents to the device. The UFP will not output electrical power externally. Generally, the UFP is a weak battery device, or a device without any batteries, such as a Bluetooth headset. The USB Type-C interface may support the insertions both from a positive side and a negative side. Since there are four groups of power sources and grounds on both sides (the positive side and the negative side), the power supported by USB Type-C interface may be greatly improved.

The power interface 100 in this embodiment may be a USB Type-C interface, which may be applied to a power adapter with the fast charging function, or a normal power adapter. The fast charging herein may refer to a charging state in which a charging current is greater than or equal to 2.5 A. The normal charging herein may refer to a charging state in which the charging current is less than 2.5 A. That is, when the power interface 100 is charged by the power adapter with the fast charging function, the charging current is greater than or equal to 2.5 A, or the rated output power is no less than 15 W. When the power interface 100 is charged by the normal power adapter, the charging current is less than 2.5 A, or the rated output power is less than 15 W.

More specifically, as shown in FIGS. 1-8, the power interface 100 may include a housing 1, a connection body 2, a partition piece 23, and an encapsulation member 24. The connection body 2 may be arranged in the housing 1, configured to be connected to the circuit board 25, and may include four power-pin assemblies 21. Each power-pin assembly 21 may include two power pins 21 spaced apart from each other in the up-down direction. The partition piece 23 may be sandwiched between the two power pins 211, such that it is possible to avoid poor contact between the connecting line and the power interface 100 caused by the movement of the two power pins 211 which are spaced apart from each other in the up-down direction towards each other. The partition piece 23 and the connection body 2 may be wrapped by the encapsulation member 24.

In this case, the encapsulation member 24 may be made of electrically insulative and heat-conductive material. The encapsulation member 24 may be configured to fix the partition piece 23, the power-pin assemblies 21 and the data pins 22 of the connection body 2, thereby ensuring the reliability of the connection between the connection line of the power adapter and the power interface 100. As shown in FIGS. 1, 5 and 6, the encapsulation member 24 may include a first encapsulation portion 241 and a second encapsulation portion 242 connected to first encapsulation portion 241. The first encapsulation portion 241 may be embedded into the second encapsulation portion 242 in this embodiment. The second encapsulation portion 242 may define a plurality of receiving groove 2421, and the first encapsulation portion 241 may include a plurality of embedding protrusions 2411. The plurality of receiving grooves 2421 may be in one-to-one correspondence with the plurality of embedding protrusions 2411, and cooperate with the plurality of embedding protrusions 2411. In this way, the reliability of the connection between the first encapsulation portion 241 and the second encapsulation portion 242 may be improved.

As shown in FIG. 3, the partition piece 23 may have a head end 23a close to a front end of the power-pin assembly 21, a tail end 23b close to a rear end of the power-pin assembly 21, and a connection portion 23c connected between the head end 23a and the tail end 23b. More specifically, the tail end 23b may be the one connected to the circuit board 25, and the head end 23a may be the one away from the circuit board 25 and opposite to the tail end 2. The head end 23a may define a through hole 231, and a reinforcing rib 232 may be arranged in the through hole 231. The reinforcing rib 232 may extend in the left-right direction. In this way, the material of the partition piece 23 may be saved, and the structural strength of the partition piece 23 may be enhanced. The head end 23a and the left-side wall face may have a reinforcing protrusion 233 that protrudes away from the connection body 2. The reinforcing protrusion 233 may increase the area of the contact face between the partition piece 23 and the encapsulation member 24, enhance the adhesion between the partition piece 23 and the encapsulation member 24, and make the connection between the partition piece 23 and the encapsulation member 24 more stable. In this way, the partition piece 23 and the connection body 2 may be better fixed together by the encapsulation member 24.

As shown in FIG. 3, a notch 234 may be defined in the connection portion 23c of the partition piece 23. The notch 234 in some embodiments may be defined in the middle of the partition piece 23. In this way, when the partition piece 23 is shifted upwardly or downwardly, the partition piece 23 may quickly return back to the original position. A crimping 235 may be arranged at the tail end 23b, the crimping 235 may be bent in a direction towards one of the pair of power pins 211. Therefore, one of the pair of power pins 211 may be wrapped by the crimping 235. The crimping 235 may increase the contact face between the partition piece 23 and the encapsulation member 24, and provide a protection to the power-pin assembly 21. The tail end 23b may have a widened portion 236, and the widened portion 236 may define a through hole 231, which further saves the material of the partition piece 23.

In addition, as shown in FIG. 1, FIG. 5 and FIG. 6, the tail end 23b may be spaced apart from the housing 1 and connected to the connection body 2. In this way, it is possible to avoid producing interference with the antenna signals, and thus the quality and the speed of signal transmission may be improved. A first pad 251 and a second pad 252 spaced apart from each other may be arranged on the circuit board 25. The housing 1 may be welded on the first pad 251, and the tail end 23b may be welded on the second pad 252. In this way, the housing 1 and the partition piece 23 may be connected to the circuit board 25, thereby firmly fixing the connection body 2 to the circuit board 25 and preventing the power pins 211 of the connection body 2 from falling off the circuit board 25, and thus the reliability of the operation of the power interface 100 may be ensured.

As shown in FIG. 2, at least one power pin 211 may include an expanded portion 2111. The expanded portion 2111 may have a cross-sectional area larger than that of a data pin 22 of the connection body 2. In this way, the current load of the power pins 211 may be increased, and the transmission speed of the current may be improved. A recess 2112 may be defined in the expanded portion 2111 at a position away from the circuit board 25. When the power interface 100 performs the fast charging function, the power pin 211 with the expanded portion 2111 may be used to carry a large charging current. When the power interface 100 performs the normal charging function, the recess 2112 on the expanded portion 2111 may prevent the power pin 211 from getting into contact with a corresponding pin of a power adapter.

In this case, as shown in FIG. 11, a thickness of the power pin 211 may be defined as D, and the cross-sectional area of the expanded portion 2111 may be defined as S. It has been experimentally verified that, when D=0.25 mm and S=0.13125 mm², the current load of the power pins 211 is at least 12A, thereby improving the charging efficiency. Furthermore, as shown in FIG. 11, when W=0.25 mm, the current load of the power pins 211 is at least 14A, thereby improving the charging efficiency.

Furthermore, as shown in FIGS. 4-8, a first stopping plate 11 may be arranged in the housing 1, and an engaging flange 2422 may be arranged on the second encapsulation portion 242. The power interface 100 may further include a second stopping plate 3. The second stopping plate 3 may be arranged in the housing 1, connected to the housing 1, and spaced apart from the first stopping plate 11. The engaging flange 2422 may be sandwiched between the first stopping plate 11 and the second stopping plate 3. In this way, the second encapsulation portion 242 may be fixed in the housing 1 by the first stopping plate 11 and the second stopping plate 3, thereby fixing the connection body 2 in the housing 1, and preventing the connection body 2 from moving in the up-down direction of the housing 1.

In this case, the first stopping plate 11 and the second stopping plate 3 may be made of metal, and the second stopping plate 3 may be made of stainless steel. The second stopping plate 3 may be connected to the housing 1 by means of spot welding. The housing 1 and the second stopping plate 3 made of metal may have a great structural strength. In this way, it is possible to enhance the structural strength of the power interface 100. In addition, since the inner space of the housing 1 is limited, when the second stopping plate 3 is welded on the housing 1, it is possible to simplify the processing and assembling processes, shorten manufacturing cycles, and reduce the manufacturing cost. A gap 31 may be defined between the second stopping plate 3 and the housing 1, and a dispensing layer may be arranged in the gap 31. On one hand, the dispensing layer may further bond the second stopping plate 3 with the housing 1 to improve the reliability of the connection between the second stopping plate 3 and the housing 1. On the other hand, the dispensing layer may have a waterproof function; that is, the dispensing layer may prevent liquid from entering the power interface 100 via an open end of the power interface 100 and damaging of the circuit board 25 inside the power interface 100, and the like, thereby ensuring the reliability of the power interface 100. In this embodiment, a pair of second stopping plates 3 may be provided. The pair of second stopping plates 3 may extend in the circumferential direction of the housing 1. The pair of second stopping plates 3 may form an annular stopping plate. In this way, the reliability of the connection between the second stopping plate 3 and the housing 1 may be enhanced, and the structure of the second stopping plate 3 may be simplified.

The first stopping plate 11 may also extend in the circumferential direction of the connection body 2. In this way, it is possible to enhance the fixing of the connection body 2 by the first stopping plate 11. A stopping protrusion 111 may be arranged on a sidewall face of the first stopping plate 11 that faces towards the second stopping plate 3, and the stopping protrusion 111 may be inserted in the engaging groove 2423 defined in the engaging flanges 2422 and engaged with the engaging flanges 2422. In this way, it is possible to prevent the connection body 2 from shaking in the housing 1 by the cooperation between the engaging flange 2422 and the stopping protrusion 111, and thus it is possible to ensure the reliability of the operation of the power interface 100.

A method for manufacturing the power interface 100 according to an embodiment of the present disclosure will now be described with reference to FIGS. 1-11. Herein, the power interface 100 may be the power interface 100 described above.

The method for manufacturing the power interface 100 according to an embodiment of the present disclosure may include operations at the following blocks.

At block S10, the housing 1 may be processed.

At block S20: the connection body 2 may be mounted into the housing 1.

At block S30: the second stopping plate 3 may be welded on an inner wall of the housing 1.

According to the method for manufacturing the power interface 100 of the embodiment of the present disclosure, the connection body 2 may be fixed in the housing 1, thereby ensuring the reliability of the operation of the power interface 100.

The housing 1 at the block S10 may be an injection molded part, and the first stopping plate 11 may be injected on the inner wall of the housing 1, which may facilitate the processing of the housing 1 and the first stopping plate 11. At the block S30, the second stopping plate 3 may be connected to the housing 1 by means of spot welding. The spot welding may be a quick and economical connection method in which the weldments may be welded to each other on the contact face at the joint between the weldments by individual welding spots.

Furthermore, a gap 31 may be defined between the second stopping plate 3 and the housing 1. The method for manufacturing the power interface 100 may further include: arranging an adhesive layer in the gap 31, such that the second stopping plate 3 and the housing 1 may be closely bonded with each other, and liquid may be prevent from entering the power interface 100.

A mobile terminal according to an embodiment of the present disclosure may include the power interface 100 as described above. The mobile terminal may realize the transmission of electrical signals and data signals via the power interface 100. For example, the mobile terminal may be electrically connected to the power adapter through the power interface 100 to implement a charging or data transmission function.

More specifically, in some embodiments, the mobile terminal may include a circuit board 25 and a power interface 100. The power interface 100 may be configured to be connected to a power adpater. The power interface 100 may include a housing 1, at least two power pins 211 spaced apart from each other arranged in the housing 1 and configured to be connected to the circuit board 25, a partition piece 23 sandwiched between the at least two power pins 211 and an encapsulation member 24 configured to wrap the partition piece 23 and the at least two power pins 211, such that the partition piece 23 may be insulated from the at least two power pins 211 by the encapsulation member 24. The partition piece 23 may include a tail end 23b connected to the circuit board 25, and a head end 23a away from the circuit board 25 and opposite to the tail end 2b. At least one of the head end 23a and the tail end 23b may define a through hole 231 and have a reinforcing rib 232 arranged in the through hole 231.

In some embodiments, the partition piece 23 may include a connection portion 23c connected between the head end 23a and the tail end 23b. A notch 234 may be defined in the connection portion 23c. A crimping 235 may be arranged at the tail end 23b, and the crimping 235 may be bent in a direction towards one of the pair of power pins 211.

In some embodiments, the encapsulation member 24 may include a first encapsulation portion 241 and a second encapsulation portion 242. The first encapsulation portion 241 may be embedded into the second encapsulation portion 242. The second encapsulation portion 242 may define a plurality of receiving groove 2421, and a plurality of embedding protrusions 2411 may be arranged on the first encapsulation portion 241. The plurality of receiving grooves 2421 may be in one-to-one correspondence with the plurality of embedding protrusions 2411.

In the power interface 100 of the embodiment of the present disclosure, by arranging the partition piece 23 between the pair of power pins 211 which are spaced apart from each other in the up-down direction, it is possible to support the power pins 211, and avoid poor contact between a connecting line and the power interface 100 caused by the movement of the pair of power pins 211 which are spaced apart from each other in the up-down direction towards each other when the connection line is inserted into the power interface. In this way, it is possible to ensure the reliability of the connection between the connection line and the power interface 100. In addition, the partition piece 23 defines the through hole 231 and the reinforcing rib 232 arranged in the through hole 231 could not only save the material of the partition piece 23, but also improve the structural strength of the partition piece 23.

A power adapter according to an embodiment of the present disclosure may include the power interface 100 as described above. The power adapter may realize the transmission of electrical signals and data signals via the power interface 100.

More specifically, in some embodiments, the power adapter may include a circuit board 25 and a power interface 100. The power interface 100 may be configured to be connected to the circuit board 25. The power interface 100 may include a housing 1, a data pin 22 received in the housing 1 and connected to the circuit board 25, at least two power pins 211 spaced apart from each other, arranged in the housing 1 and configured to be connected to the circuit board 25 and a partition piece 23 sandwiched between the at least two power pins 211 to support the at least two power pins 211. The partition piece 23 may include a tail end 23b connected to the circuit board 25, a head end 23a away from the circuit board 25 and opposite to the tail end 23b, and a connection portion 23c connected between the head end 23a and the tail end 23b and defining a notch 234. At least one of the head end 23a and the tail end 23b may define a through hole 231 and have a reinforcing rib 232 arranged in the through hole 231.

In some embodiments, the power adapter may further include an encapsulation member 24 configured to wrap the partition piece 23, the data pin 22 and the at least two power pins 211, such that the partition piece 23 may be insulated from the at least two power pins 211 by the encapsulation member 24. The encapsulation member 24 may include a first encapsulation portion 241 and a second encapsulation portion 242. The first encapsulation portion 241 may be embedded into the second encapsulation portion 242. The second encapsulation portion 242 may define a plurality of receiving groove 2421, and a plurality of embedding protrusions 2411 may be arranged on the first encapsulation portion 241. The plurality of receiving grooves 2421 may be in one-to-one correspondence with the plurality of embedding protrusions 2411.

The power adapter according to an embodiment of the present disclosure, by spacing apart the tail end 23b of the partition piece 23 from the housing 1 and connecting the tail end 23b of the partition piece 23 to the connection body 2, it is possible to avoid producing interference with antenna signals, and thus the quality and the speed of signal transmission may be improved. In addition, both the tail end 23b and the housing 1 may be connected to the connection body 2. In this way, the partition piece 23, the housing 1, and the connection body 2 may be connected to each other, thereby improving the reliability of the connection among the partition piece 23, the housing 1, and the connection body 2.

Reference throughout this specification, the reference terms "an embodiment", "some embodiments", "an example", "a specific example", or "some examples", and the like means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, one skilled in the art may combine the different embodiments or examples described in this specification and features of different embodiments or examples without conflicting with each other.

Although explanatory embodiments have been shown and described, it would be appreciated by one skilled in the art that the above embodiments previously described are illustrative, and cannot be construed to limit the present disclosure. Changes, alternatives, and modifications can be made in the embodiments without departing from scope of the present disclosure.

What is claimed is:

1. A power interface, comprising:
a housing; comprising a first stopping plate;
a second stopping plate, arranged in the housing, connected to the housing, and spaced apart from the first stopping plate;
a connection body, arranged in the housing, configured to be connected to a circuit board, and comprising at least one power-pin assembly; wherein each of the at least one power-pin assembly comprises a pair of power pins spaced apart from each other in a first direction;
a partition piece, sandwiched between the pair of power pins, extending along a second direction perpendicular to the first direction, and comprising a tail end connected to the circuit board and a head end away from the circuit board and opposite to the tail end in the second direction; wherein at least one of the head end and the tail end defines a through hole and has a reinforcing rib arranged in the through hole; and
an encapsulation member, configured to wrap the partition piece and the connection body, and comprising an engaging flange sandwiched between the first stopping plate and the second stopping plate,
wherein a crimping is arranged at the tail end, bent around an axis parallel to one of the pair of power pins to wrap the one of the pair of power pins, and wrapped by the encapsulation member.

2. The power interface of claim 1, wherein the reinforcing rib comprises a first end and a second end opposite to the first end, both the first end and the second end are connected to the partition piece, and an extending direction from the first end to the second end is perpendicular to the first and second direction.

3. The power interface of claim 1, wherein the reinforcing rib comprises a first end and a second end opposite to the first end, both the first end and the second end are connected to the partition piece, and an extending direction from the first end to the second end is the second direction.

4. The power interface of claim 1, wherein the reinforcing rib comprises a first end and a second end opposite to the first end, both the first end and the second end are connected to the partition piece, and an extending direction from the first end to the second end forms an angle with a third direction perpendicular to the first and second direction.

5. The power interface of claim 1, wherein a reinforcing protrusion protrudes from an outer face of the head end in a direction away from a center of the power interface.

6. The power interface of claim 1, wherein the partition piece comprises a connection portion connected between the head end and the tail end; a notch is defined in the connection portion.

7. The power interface of claim 1, wherein the encapsulation member is made of electrically insulative and heat-conductive material.

8. The power interface of claim 7, wherein the encapsulation member comprises a first encapsulation portion and a second encapsulation portion connected to the first encapsulation portion; the second encapsulation portion defines a plurality of receiving grooves, and a plurality of embedding protrusions are arranged on the first encapsulation portion; the plurality of receiving grooves are in one-to-one correspondence with the plurality of embedding protrusions.

9. The power interface of claim 1, wherein the connection body further comprise a data pin; at least one of the pair of power pins comprises an expanded portion, and the expanded portion has a cross-sectional area larger than that of the data pin of the connection body to increase a current load of the at least one of the pair of power pins.

10. The power interface of claim 9, wherein an end of each of the pair of power pins is connected to the circuit board, a recess is defined in the expanded portion at a position that away from the circuit board.

11. The power interface of claim 9, wherein the expanded portion is located in the middle part of the at least one of the pair of power pins.

12. The power interface of claim 9, wherein the expanded portion has a cross-sectional area S, and the cross-sectional area S satisfies: $S \geq 0.09805$ mm$^2$.

13. The power interface of claim 1, wherein each of the pair of power pins has a thickness D, and the thickness D satisfies: $0.1$ mm$\leq D \leq 0.3$ mm.

14. A mobile terminal, comprising:
a circuit board;
a housing; comprising a first stopping plate;
a second stopping plate, arranged in the housing, connected to the housing, and spaced apart from the first stopping plate;
at least two power pins spaced apart from each other, arranged in the housing and configured to be connected to the circuit board;
a partition piece, sandwiched between the at least two power pins and comprising:
a tail end, connected to the circuit board; and
a head end, away from the circuit board and opposite to the tail end, wherein at least one of the head end and the tail end defines a through hole and has a reinforcing rib arranged in the through hole; and
an encapsulation member, configured to wrap the partition piece and the at least two power pins, such that the partition piece is insulated from the at least two power pins by the encapsulation member; the encapsulation member comprises an engaging flange sandwiched between the first stopping plate and the second stopping plate;
wherein the second stopping plate extends in a circumferential direction of the encapsulation member;
wherein a crimping is arranged at the tail end, bent around an axis parallel to one of the pair of power pins to wrap the one of the pair of power pins, and wrapped by the encapsulation member.

15. The mobile terminal of claim 14, wherein the partition piece comprises a connection portion connected between the head end and the tail end; a notch is defined in the connection portion.

16. The mobile terminal of claim 14, wherein the encapsulation member comprises a first encapsulation portion and a second encapsulation portion; the first encapsulation portion is embedded into the second encapsulation portion;
the second encapsulation portion defines a plurality of receiving grooves, and a plurality of embedding protrusions are arranged on the first encapsulation portion; the plurality of receiving grooves are in one-to-one correspondence with the plurality of embedding protrusions.

17. A power adapter, comprising:
a circuit board; and
a power interface configured to be connected to the circuit board and comprising:
a housing;
a data pin, received in the housing and connected to the circuit board;
at least two power pins spaced apart from each other, arranged in the housing and configured to be connected to the circuit board;
a partition piece, sandwiched between the at least two power pins to support the at least two power pins and comprising:
a tail end, connected to the circuit board;
a head end, away from the circuit board and opposite to the tail end, wherein at least one of the head end and the tail end defines a through hole and has a reinforcing rib arranged in the through hole; and
a connection portion, connected between the head end and the tail end and defining a notch; and
an encapsulation member configured to wrap the partition piece, the data pin and the at least two power pins, such that the partition piece is insulated from the at least two power pins by the encapsulation member;
wherein a crimping is arranged at the tail end, bent around an axis parallel to one of the pair of power pins to wrap the one of the pair of power pins, and wrapped by the encapsulation member.

18. The power adapter of claim 17, wherein the encapsulation member comprises a first encapsulation portion and a second encapsulation portion; the first encapsulation portion is embedded into the second encapsulation portion;
the second encapsulation portion defines a plurality of receiving grooves, and a plurality of embedding protrusions are arranged on the first encapsulation portion; the plurality of receiving grooves are in one-to-one correspondence with the plurality of embedding protrusions.

19. The mobile terminal of claim 14, wherein the second stopping plate defines a hole through which the at least two pins penetrate.

* * * * *